(12) United States Patent
Warren

(10) Patent No.: US 6,558,868 B2
(45) Date of Patent: May 6, 2003

(54) METHOD OF FABRICATING A HIGH ASPECT RATIO MICROSTRUCTURE

(75) Inventor: John B. Warren, Port Jefferson, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 82 days.

(21) Appl. No.: 09/785,053

(22) Filed: Feb. 16, 2001

(65) Prior Publication Data

US 2002/0115016 A1 Aug. 22, 2002

(51) Int. Cl.[7] ............................................. G03F 7/004
(52) U.S. Cl. .................. 430/259; 430/260; 430/271.1; 430/281.1; 430/320
(58) Field of Search .................. 430/259, 258, 430/260, 270.1, 271.1, 281.1, 320, 322, 331

(56) References Cited

U.S. PATENT DOCUMENTS

| 5,026,624 A | | 6/1991 | Day et al. .................. 430/280 |
| 5,054,872 A | * | 10/1991 | Fan et al. .................. 385/130 |
| 6,391,523 B1 | * | 5/2002 | Hurditch et al. .......... 430/280.1 |
| 2002/0006588 A1 | * | 1/2002 | Afromowitz ................ 430/322 |
| 2002/0012884 A1 | * | 1/2002 | Gleason et al. ............. 430/313 |

FOREIGN PATENT DOCUMENTS

EP 0851295 12/1996

OTHER PUBLICATIONS

Lee, et al., "Micromachining Applications of a High Resolution Ultrathick Potoresist", J Vac. Sci. Technol. B 13(6) Nov./Dec. 1995.

Kim, et al., "Application of the LIGA Process for Fabrication of Gas Avalanche Devices", IEEE Transactions on Nuclear Science, vol. 47, No. 3, Jun. 2000.

Rehak, et al., "A New Technique for Fabrication of the Gas Electron Multiplier", submitted for Fall 2000 IEEE Meeting.

* cited by examiner

Primary Examiner—Rosemary Ashton
Assistant Examiner—Yvette C. Thornton
(74) Attorney, Agent, or Firm—Margaret C. Bogosian

(57) ABSTRACT

The present invention is for a method of fabricating a high aspect ratio, freestanding microstructure. The fabrication method modifies the exposure process for SU-8, an negative-acting, ultraviolet-sensitive photoresist used for microfabrication whereby a UV-absorbent glass substrate, chosen for complete absorption of UV radiation at 380 nanometers or less, is coated with a negative photoresist, exposed and developed according to standard practice. This UV absorbent glass enables the fabrication of cylindrical cavities in a negative photoresist microstructures that have aspect ratios of 8:1.

2 Claims, 2 Drawing Sheets

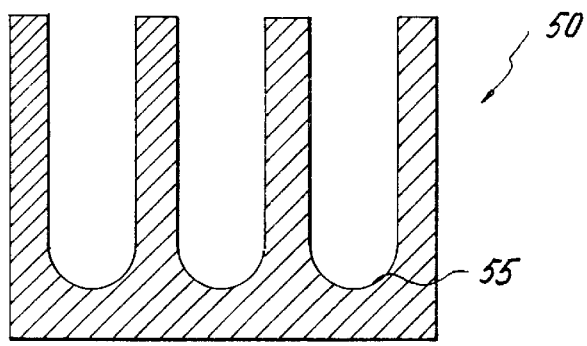
Fig. 3
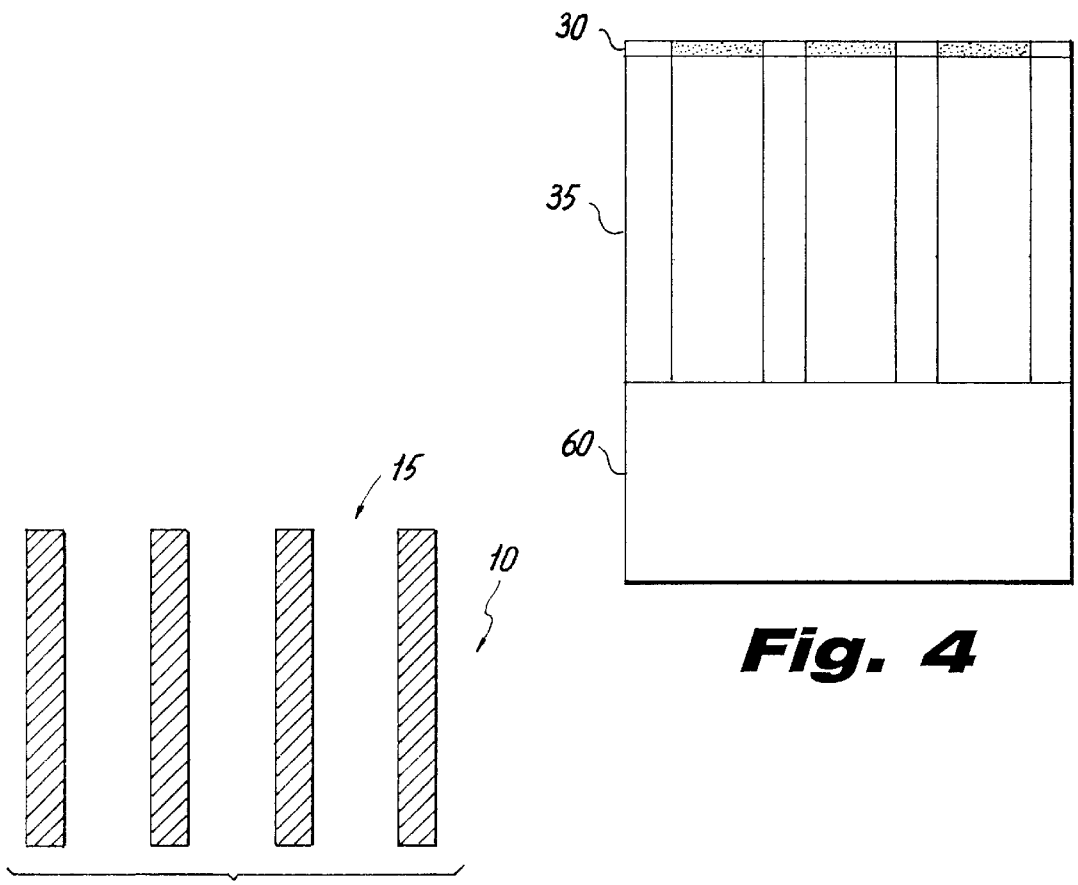
Fig. 4
Fig. 5

METHOD OF FABRICATING A HIGH ASPECT RATIO MICROSTRUCTURE

This invention was made with Government support under contract number DE-AC02-98CH10886, awarded by the U.S. Department of Energy. The Government has certain rights in the invention.

BACKGROUND OF THE INVENTION

1. Field of the Invention

The present invention relates to a method of fabricating a high aspect ratio, freestanding microstructure and more particularly a freestanding membrane containing an array of cylindrical cavities.

2. Description of the Prior Art

High aspect ratio microfabrication was known as the "LIGA" process, (Lithography, Plastic Forming, and Galvanoforming). In this method, an intense, highly collimated beam of X-rays from a synchrotron (5 to 15 keV in energy) is used to expose polymethyl methacrylate (PMMA), an X-ray sensitive resist that can be up to several millimeters in thickness. The exposed PMMA microstructure can be used as a stand-alone component or as a sacrificial mold for the fabrication of metallic components by electroforming.

After the exposure and development steps in the LIGA process, PMMA microstructures a few microns in width and several hundred microns high can be fabricated. The height of any given microstructure divided by its width is commonly known as the "aspect ratio" and the LIGA process can achieve aspect ratios in excess of 50:1. Nevertheless, this process requires X-ray compatible masks and access to a synchrotron. Processes requiring only UV radiation and UV-transparent masks are much more economical. Interest has thus increased in a competitive process to LIGA that uses SU-8, a negative-acting photoresist that is sensitive to ultraviolet radiation, rather than X-rays. This resist is sufficiently transparent at the exposing wavelength (typically 365 nanometers) that thickness' as great as one millimeter can be patterned by exposure tools commonly available to any semiconductor fabrication or microfabrication facility. Since the SU-8 process uses industry standard quartz masks, and requires no specialized equipment such as a synchrotron for exposure, it is much more economical than the LIGA process and is used to fabricate a wide variety of components with dimensions on the order of a few hundred microns. As with the LIGA process, microstructures fabricated from a negative photoresist 8 can be used as the final components in products such as watch gear assemblies, or as sacrificial molds for the mass-production of metal components using electroforming.

Components fabricated with negative photoresists have been shown with aspect ratios of 20:1. However, experiments have shown that these aspect ratios are not nearly as great for cylindrical cavity's as they are for cylindrical pillars with identical diameters. This effect becomes particularly pronounced when the cavity diameter is less than 100 microns.

A previous patent describing the process for producing multi-layer microstructures using the SU-8 resin is found in European Patent EP 0,851,295 to Lorenz and Renaud. This patent describes a method involving use of a sacrificial coating on the support plate and use of at least two thick layers of SU-8 to form the final microcomponent.

U.S. Pat. No. 5,026,624 to Day et al. describes a composition for photoimaging which can be used as the negative photoresist. This patent describes photoimagable compositions, and particularly a cationically polymerizable epoxy resin system having photoinitiators and optionally photosensitizers added thereto which resin system has improved rheological properties and also improved photoimaging properties.

There is interest to develop microstructures fabricated with negative photoresists as essential components in X-ray detectors known as Gas Electron Multipliers, and electron photomultipliers known as microchannel plates.

SUMMARY OF THE INVENTION

An object of the present invention is to provide a method of fabricating high aspect ratio, freestanding three-dimensional microstructures. An additional object is to fabricate membranes that are composed of arrays of cylindrical cavity microstructures.

A method of fabricating a high aspect ratio, freestanding three-dimensional microstructure, comprises the application of a layer of negative photoresist sensitive to ultraviolet radiation with a thickness between 50 microns and 700 microns; whereby the photoresist, is formed by a lacquer containing a polyfunctional epoxy composition, a photoinitiator containing triarylsulfonium salts, and a solvent that is cast on a UV absorbent substrate. Then heating the layer between 90° C. and 95° C. for a period depending on the thickness deposited to cause the solvent to be evaporated. The UV illumination is carried out at a wavelength of about 365 nm and an intensity of 200 to 100 millijoules/cm$^2$, depending on thickness of the layer, through a mask corresponding to the impression desired whereby the UV absorbent substrate filters out the UV radiation. The resist is baked for at least 5 minutes at about 95° C. to ensure cross-linking in the UV-exposed regions. The unexposed photoresist is developed by means of a solvent chosen from among GBL (gamma butyrolactone) and PGMEA (propylene glycol methylethyl acetate). Lastly, the microstructure obtained by this procedure is separated from the UV absorbent substrate.

BRIEF DESCRIPTION OF THE DRAWINGS

In the accompanying drawings:

FIG. 3 is a cross section of the prior art microstructure showing the remaining cross-linked material;

FIG. 4 is a side view of the prior art showing the mask, negative photoresist and UV absorbent substrate; and FIG. 5 is a cross section view of the resulting microstructure after development.

DETAILED DESCRIPTION

Figure 1:
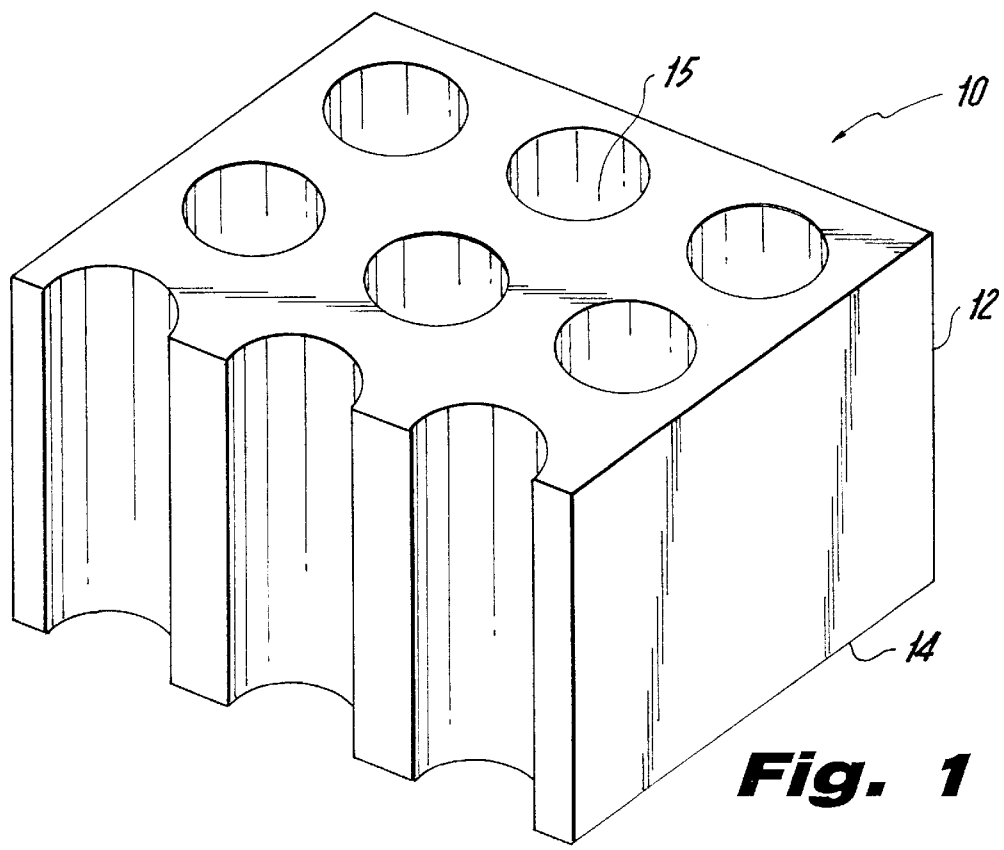
FIG. 1 is a perspective view of the prior art showing a small segment of the microstructure which may comprise several thousand cylindrical cavities.
Figure 2:
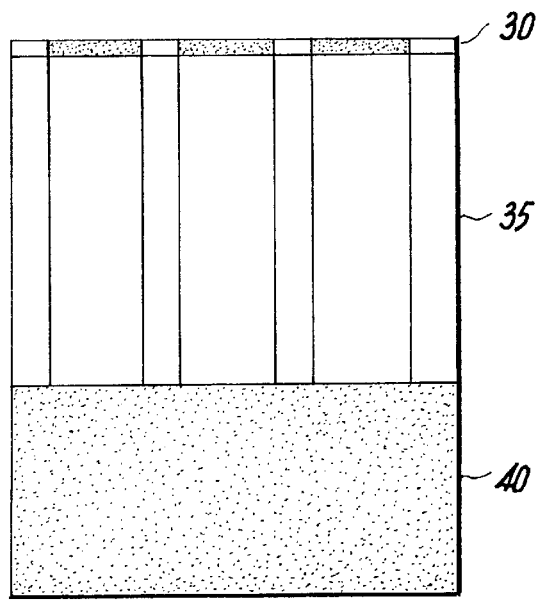
FIG. 2 is a side view of the prior art microstructure showing the mask, a negative photoresist, and UV reflecting substrate.

FIG. 1 shows a section of a microstructure 10 composed of ideal cylindrical array of holes 100 microns in diameter and 500 microns high. In the preferred embodiment the microstructure 10 is composed of a negative photoresist, commonly known as SU-8. These aspect ratios are typically encountered in gas electron multiplier or microchannel plate geometry. To fabricate this structure, UV radiation from a mask aligner's mercury arc lamp is used to expose the negative photoresist through a mask, consisting of a patterned chromium film on a quartz mask plate shown in FIG.

2. UV radiation passing through the clear areas of the mask is absorbed by the negative photoresist, causing the material to cross-link and become insoluble in the developing solution used to dissolve unexposed negative photoresist.

The UV radiation must be perfectly parallel if a closely spaced array of holes is to be fabricated. However, lens aberrations and the fact that the mask aligner UV lamp is not a point source prevent the radiation from being perfectly collimated. Some radiation not parallel to the optical axis of the mask aligner will always be present. This off-axis radiation can thus be reflected from the substrate on which the negative photoresist is cast and exposes regions that would have been protected by the opaque portion of the mask for perfectly parallel radiation. For example, UV radiation that passes through a 500 micron thick negative photoresist layer is reduced in intensity by 50% due to absorption. However, the off-axis radiation component is still sufficiently intense to enable the exposure of regions at the bottom of the negative photoresist layer that would not be exposed for perfectly parallel radiation.

The extent of the exposed region within the 100 um diameter hole is greatest near the substrate floor 55 in FIG. 3, where the reflected off-axis radiation has undergone the least absorption. This effect becomes increasingly prominent as the aspect ratio increases (i.e., holes with smaller diameters relative to component thickness). Experiments have shown that cavities with aspect ratios as little as 2:1 begin to show clogging at the bottom of the cavity 55 when the cavity diameter is less than 100 microns.

An ideal substrate would therefore be a UV absorbent material that can withstand the 95° C. temperature required during the SU-8 prebake step, demonstrates resistance to the developers used in thenegative photoresist development process, exhibits optical flatness to minimize off-axis reflection, and can be easily removed after the microstructure component is fabricated. Additionally, the substrate must have a low thermal coefficient of expansion. This property, when coupled with the relatively high thermal coefficient of expansion of the negative photoresist SU-8, allows residual thermal-induced stress's in the final negative photoresist microstructure to minimize adherence, permitting easy component removal after development. A substrate with all of these properties enables fabrication of the desired structure as shown in FIG. 5 without stray radiation causing cross-linking in unwanted regions.

All common substrates 40 that have heretofore been used for the negative photoresist SU-8 process, such as metal-coated silicon wafers, exhibit significant UV reflectivity at wavelengths less than 380 nanometers and are not suitable to fabricate microstructures with the desired aspect ratios. UV-transparent substrates such as quartz, have the required physical properties but allow the UV radiation to pass unimpeded to the support on which the quartz substrate is placed, where it is then reflected upwards to expose undesired areas. However, experiments have shown that glass wafers composed of UV-absorbent material such as yellow filter glass (Schott No. 355), manufactured by the Schott Glass Technologies, Inc., completely filter out the UV radiation and prevent the reflectivity effect. Wafers with this composition also meet the chemical and structural requirements. Only by using such a substrate can negative photoresist components such as shown in FIG. 1 can be successfully fabricated. A component with these aspect ratios cannot be fabricated using conventional technology.

According to the present invention, the method of fabricating high aspect ratio, freestanding three-dimensional microstructure 10, comprises applying a layer of negative photoresist 35 sensitive to ultraviolet radiation with a thickness between 50 microns and 700 microns, preferably 400 microns. The photoresist layer 35 is formed by a lacquer containing a solvent, a polyfunctional epoxy composition and a photoinitiator containing triarylsulfonium salts on a UV absorbent substrate 60.

The photoresist layer 35 is heated between 90° C. and 95° C. for a period depending on the thickness deposited. The heating period is proportional to the square of the deposited thickness. This heating period is longer than in the prior art.

Next, UV radiation with a wavelength of about 365 nanometers, and an intensity of 200 to 1000 millijoule/cm$^2$ is used to illuminate a mask 30 corresponding to the impression desired whereby the UV absorbent substrate 60 filters out the UV radiation. The photoresist 35 is baked at about 95° C. to promote the cross-linking in the resist. In the preferred embodiment the photoresist 35 is baked is for at least five minutes.

The unexposed photoresist 35 is developed by means of a solvent chosen from among GBL (gamma butyrolactone) and PGMEA (propylene glycol methylethyl acetate). Lastly, the microstructure 10 is separated from the UV absorbent substrate 60.

For appropriate annealing times, the completed microstructure is only weakly adherent to the substrate. The annealing times required to ensure easy removal are proportional to the square of the deposited thickness. The separation of the microstructure 10 from the UV absorbent substrate 60 can be accomplished by peeling the microstructure 10 from the UV absorbent substrate 60. In the preferred embodiment the microstructure 10 is stripped from the UV absorbent substrate 60 with a blade (not shown). An alternative embodiment to the striping method is placing the microstructure 10 in an ultrasonic bath solvent (not shown) chosen from among GBL (gamma butyrolactone) and PGMEA (propylene glycol methylethyl acetate) whereby the microstructure separates from the UV substrate with mechanical agitation.

In the preferred embodiment, the microstructure 10 has a height 12 and width 14 whereby the ratio of the height 12 to the width 14 is at least 2 to 1. The aspect ratio can be as great as eight to one.

Although the invention is described herein with reference to the preferred embodiment, one skilled in the art will readily appreciate that other embodiments may be substituted for those set forth herein without departing from the spirit and scope of the present invention. As such, the described embodiments are not intended to be exhaustive or to limit the invention to the precise forms disclosed, and obviously many modifications and variations are possible in light of the above teaching. The embodiments were chosen and described in order to best explain the principles of the invention and its practical application. It is intended that the scope of the invention be defined by the claims appended hereto and their equivalents.

What is claimed is:

1. A method of fabricating high aspect ratio, freestanding three-dimensional microstructure, comprising the steps of:
   a. applying a layer of negative photoresist sensitive to ultraviolet radiation with a thickness between 50 microns and 700 microns on to a UV absorbent substrate, whereby the layer of negative photoresist is formed by a lacquer containing a polyfunctional epoxy composition, a photoinitiator containing triarylsulfonium salts, and a solvent;

b. heating the layer of negative photoresist between 90 and 95° C. for a period depending on the thickness deposited to remove the solvent;

c. carrying out UV illumination at a wavelength of about 365 nanometers and an intensity of between 200 and 1000 mJ/cm$^2$ dependent on thickness of the layer, through a mask corresponding to the impression desired whereby the UV absorbent substrate filters out the UV radiation;

d. baking the photoresist after UV exposure at about 95° C. to promote the cross-linking in the resist;

e. developing the unexposed photoresist by means of a solvent chosen from among gamma butyrolactone and propylene glycol methylethyl acetate; and f. separating the microstructure obtained in step (e) from the UV absorbent substrate wherein the separation of the microstructure from the UV absorbent substrate comprises peeling the microstructure from the UV absorbent substrate.

2. A method of fabricating high aspect ratio, freestanding three-dimensional microstructure, comprising the steps of:

a. applying a layer of negative photoresist sensitive to ultraviolet radiation with a thickness between 50 microns and 700 microns on to a UV absorbent substrate, whereby the layer of negative photoresist is formed by a lacquer containing a polyfunctional epoxy composition, a photoinitiator containing triarylsulfonium salts, and a solvent;

b. heating the layer of negative photoresist between 90 and 95° C. for a period depending on the thickness deposited to remove the solvent;

c. carrying out UV illumination at a wavelength of about 365 nanometers and an intensity of between 200 and 1000 mJ/cm$^2$ dependent on thickness of the layer, through a mask corresponding to the impression desired whereby the UV absorbent substrate filters out the UV radiation;

d. baking the photoresist after UV exposure at about 95° C. to promote the cross-linking in the resist;

e. developing the unexposed photoresist by means of a solvent chosen from among gamma butyrolactone and propylene glycol methylethyl acetate; and f. separating the microstructure obtained in step (e) from the UV absorbent substrate wherein the separation of the microstructure from the UV absorbent substrate comprises placing the microstructure in a ultrasonic bath solvent chosen from among gamma butyrolactone and propylene glycol methylethyl acetate.

* * * * *